United States Patent
Demmin et al.

(10) Patent No.: US 6,635,185 B2
(45) Date of Patent: Oct. 21, 2003

(54) METHOD OF ETCHING AND CLEANING USING FLUORINATED CARBONYL COMPOUNDS

(75) Inventors: Timothy R. Demmin, Grand Island, NY (US); Matthew H. Luly, Lancaster, NY (US); Mohammed A. Fathimulla, Ellicott City, MD (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/001,325

(22) Filed: Dec. 31, 1997

(65) Prior Publication Data

US 2002/0096487 A1 Jul. 25, 2002

(51) Int. Cl.⁷ ............... H01L 21/3065; H01L 21/02; B44C 1/22; C03C 15/00; C23F 1/10
(52) U.S. Cl. ............... 216/64; 134/1.1; 134/1.2; 216/67; 252/79.1
(58) Field of Search .............. 134/1.1, 1.2; 216/64, 216/67; 252/79.1

(56) References Cited

U.S. PATENT DOCUMENTS

| | | | |
|---|---|---|---|
| 2,904,403 A | 9/1959 | Smith | 23/205 |
| 3,367,745 A | 2/1968 | Tepp | 23/205 |
| 4,181,678 A | * 1/1980 | Psarras | 562/850 |
| 4,181,679 A | * 1/1980 | Psarras | 562/849 |
| 4,260,561 A | 4/1981 | Franz | 562/852 |
| 4,260,649 A | 4/1981 | Dension et al. | 427/53.1 |
| 4,498,953 A | 2/1985 | Cook et al. | 156/646 |
| 5,254,176 A | 10/1993 | Ibuka et al. | 134/2 |
| 5,338,394 A | 8/1994 | Fathimulla et al. | 156/643 |
| 5,376,234 A | 12/1994 | Yanagida | 156/662 |
| 5,445,712 A | 8/1995 | Yanagida | 156/662 |
| 5,534,107 A | 7/1996 | Gray et al. | 156/643.1 |
| 5,545,774 A | 8/1996 | Rao | 570/168 |
| 5,565,038 A | 10/1996 | Ashley | 134/2 |
| 5,574,192 A | 11/1996 | VanDerPuy et al. | 570/167 |
| 5,594,159 A | 1/1997 | Jackson et al. | 570/142 |
| 5,626,775 A | 5/1997 | Roberts et al. | 216/67 |

FOREIGN PATENT DOCUMENTS

| | | |
|---|---|---|
| DE | 30 13 679 A | 11/1980 |
| EP | 0 776 032 A | 5/1997 |
| JP | 6-99358 | 6/1994 |

OTHER PUBLICATIONS

Dry Etching, pp. 8–1 to 8–30; Integrated Circuit Engineering Corporation.
IBM J. Res. Develop. —vol. 23—No. 1—Jan. 1979 J.W. Coburn, Eric Kay; Some Chemical Aspects of the Fluorocarbon Plasma Etching of Silicon and Its Compounds.
J.Appl.Phys.56(10) Nov. 1984; American Institute of Physics; pp. 2939–2042; Plasmaless dry etching of silicon with fluorine–containing compounds; Ibbotson et al.
1996 American Vacuum Society; J.Vac.Sci. Technol. A 14(4), Jul./Aug. 1996; pp. 2127–2136; Fluorocarbon high density plasmas. VII. Investigation of selective $SiO_2$–to–$Si_3N_4$ high density plasma etch processes; Ying Zhang et al.
Thin Film Processes; 1978; W. Kern; pp. 497–529.
Plasma Etching An Introduction; by Dennis M. Manos & Daniel L. Flamm; 1989; pp. 91–177.

* cited by examiner

*Primary Examiner*—Rabon Sergent
(74) *Attorney, Agent, or Firm*—Deborah M. Chess; Collen D. Szuch

(57) ABSTRACT

A method comprising etching a material under plasma etching conditions using an etching composition which has a GWP of no greater than about 3000 and which comprises at least one etchant compound having a formula selected from the group consisting of $F-CO-[(CR^1R^2)_m-CO]_n-F$ and $F-CO-R^3-CO-F$, and wherein:

m=0, 1, 2, 3, 4, or 5;

n=1;

$R^1$ & $R^2$ represent H, F or $C_xH_yF_z$; wherein:
x=1 or 2; and
y+z=2x+1;

$R^3$ represents $CR^4=CR^5$, $R^6R^7C=C$ or $C\equiv C$; wherein:
$R^{4-7}$ represent H, F, or $C_xH_yF_z$; wherein:
x=1 or 2; and
y+z=2x+1;

and also including the cleaning of a surface by use of an etchant compound, and further including an etching composition which includes said etchant compound and also an etchant-modifier.

23 Claims, No Drawings

METHOD OF ETCHING AND CLEANING USING FLUORINATED CARBONYL COMPOUNDS

FIELD OF INVENTION

The present invention relates generally to dry etching and cleaning. More specifically, this invention relates to the use of a family of fluorinated carbonyl compounds for the plasma etching of semiconductor materials and for the cleaning of apparatus used in the manufacture of semiconductors.

BACKGROUND OF THE INVENTION

Semiconducting devices are manufactured by the repetitive application of four basic operations to a wafer, namely: layering, patterning/etching, doping, and heat treatments. Of particular interest herein is patterning/etching which involves the selective removal of material from the surface of the wafer. More specifically, material is removed by applying a photoresist to a wafer's surface in a particular geometric pattern selectively and then exposing the wafer to a chemical etchant. Those areas of the wafer that are covered by the photoresist are protected from the etchant, while those that are left exposed are removed to some degree by the etchant. Consequently, material is removed in a geometrical pattern as defined by the photoresist. The term "etching" refers to this selective removal of material.

There are basically two types of etching, wet and dry. Wet etching involves the use of liquid corrosive reagents that react with the unprotected material on the wafer's surface and form soluble products which are then carried away by a solvent. Dry etching refers to plasma and plasma-generated methods which employ energetic gas molecules, ions, and/or free radicals that remove material from a wafer's unprotected surface either chemically by reacting with the material, or physically by bombarding the surface. This plasma process can be used also to clean surfaces of reactors and other apparatus used in the manufacture of semiconductors. Thus, discussion directed to etching and etchants herein applies also to cleaning applications. Other terms commonly applied to these plasma processes include plasma etching, reactive-ion etching, high-density plasma etching, ion milling, reactive ion milling, chemical ion beam etching, and sputter etching. Recently, the industry has been moving away from wet etching and toward dry etching due to the more refined patterning control the latter offers.

As the semiconductor industry moves toward dry etching, environmental concerns grow over the use and disposal of the etching chemicals used and the by-products which are formed. In etching, a portion of the etching chemical tends not to react and exits in the effluent from the reaction, along with various reaction by-products. Venting of such etching chemicals is coming under increased scrutiny.

Traditional etching chemicals, such as, for example, carbon tetrafluoride, hexafluoroethane, perfluoropropane, nitrogen trifluoride, bis(trifluoromethyl) disulfide, and sulfur hexafluoride, and their perfluorinated by-products, such as carbon tetrafluoride and hexafluoroethane, have relatively high Global Warming Potentials. Global Warming Potential (herein "GWP") refers to a compound's ability, relative to $CO_2$, to contribute to global warming. GWP is a calculated value based on a compound's estimated atmospheric lifetime and its ability to absorb infrared radiation. GWPs are reported by the Intergovernmental Panel on Climate Change (IPCC) for different time horizons, with a 100-year horizon being the most common. As used herein, a GWP is based on a 100-year horizon unless otherwise stated. Increasingly, governments and international treaties are requiring that the venting of such high-GWP chemicals be reduced or eliminated. As a consequence of these restrictions, the commercial-availability of these chemicals for semiconductor fabrication is suffering.

Currently, attempts to alleviate the environmental concerns associated with plasma etching and cleaning fall into one of four categories: (1) optimizing etching and/or cleaning processes such that lower amounts of GWP chemicals are emitted into the atmosphere; (2) recycling etching and/or cleaning chemicals from an exhaust stream so that they can be disposed of properly or reused without atmospheric emissions; (3) abating etching and/or cleaning chemicals in exhaust streams by chemical reaction or burn boxes which incinerate and render the unreacted etching and/or cleaning chemical effluents inoffensive, particularly with regard to GWP; and (4) selecting or developing various replacement chemicals for etching and/or cleaning duty. Regarding the first approach, advancements in optimizing the etching and cleaning processes to reduce releases are being made continuously; however, the advancements are not capable of reducing emissions to acceptable levels. Regarding the recycling and abating approaches, although emissions can be reduced, the cost of implementation is relatively high, and, again, the reduction levels still tend to be inadequate. Therefore, replacing the traditional etching chemicals with environmentally-acceptable substitutes appears to be a solution that should be considered.

Accordingly, a need exists for etching and cleaning compositions which have acceptable performance, but which do not contribute significantly to global warming when by-products or unreacted chemicals are vented to the atmosphere. The present invention fulfills this need among others.

DESCRIPTION OF THE INVENTION AND PREFERRED EMBODIMENTS

The present invention identifies a family of fluorinated carbonyl compounds which are useful as etchant compounds and which are environmentally acceptable. More specifically, the family of fluorinated carbonyl compounds includes compounds having one of the following two formulas:

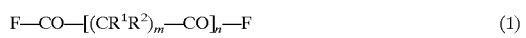

(1)

wherein:
  m=0, 1, 2, 3, 4, or 5
  n=0 or 1
  $R^1$ & $R^2$ represent H, F or $C_xH_yF_z$; wherein:
    x=1 or 2; and
    y+z=2x+1;

(2)

wherein:
  $R^3$ represents $CR^4=CR^5$, $R^6R^7C=C$ or $C\equiv C$; wherein:
    $R^{4-7}$ represent H, F, or $C_xH_yF_z$; wherein:
      x=1 or 2; and
      y+z=2x+1.

These compounds, herein referred to as "etchant compounds," regardless of their use as etchants or cleaners, tend to have low GWPs and to form by-products having low-GWP during plasma etching/cleaning such that the reaction effluent of unreacted compounds and reaction by-products is relatively benign to the environment. In addition to being environmentally acceptable, these etchant compounds react surprisingly well with a variety of materials under plasma etching conditions. Examples of such materials include, but are not limited to: dielectrics such as carbides, borides and silicides of metals or semi-metals, for example, tungsten silicide; insulators, such as oxides, nitrides of metals or semi-metals, for example, silicon dioxide, silicon nitride, silicon oxynitride, boronphosphorus silicate glass, and fluorosilicate glass; III-V semiconductor compounds such as indium phosphide; elemental materials, such as silicon, polycrystalline silicon, tungsten, titanium, vanadium, germanium, silicon-germanium; and combination of two or more thereof.

One aspect of the invention is the provision of a method for etching using the above-identified etchant compounds. In one embodiment, the method comprises subjecting a material under plasma etching conditions to an etching composition which has a GWP of no greater than about 3000 and which comprises an etchant compound of Formula (1) wherein n=1 or an etchant compound of Formula (2). In another embodiment, the method comprises subjecting a material under plasma etching conditions to an etching composition comprising an etchant compound of Formula (1) wherein m&n≧0 or an etchant compound of Formula (2). In yet another embodiment, the method comprises subjecting a non-silicon or non-silicon dioxide material under plasma etching conditions to an etching composition comprising an etchant compound of Formula (1) or (2).

Another aspect of the invention is the provision of a method for cleaning accumulated films or residue from a surface of an apparatus, such as an etching chamber and other semiconductor processing device, using the above-identified etchant compounds. In a preferred embodiment, the cleaning method comprises subjecting the accumulated film or residue under plasma cleaning conditions to an etching composition which is substantially free from traditional high-GWP etchant chemicals and which comprises an etchant compound of Formula (1) or (2).

Yet another aspect of the invention is the provision of an etching/cleaning composition comprising the above-identified etchant compounds. In a preferred embodiment, the composition comprises an etchant compound of Formula (1) or (2) and another material, different from the etchant compound, to enhance or modify the etching characteristics of the etchant compound.

The various aspects of the present invention relate to the identification of the fluorinated carbonyl compounds of Formulas (1) and (2) as effective etchant compounds for use in etching/cleaning compositions. In a preferred embodiment, the etchant compound is selected either from Formula (1) wherein: at least one of $R^1$ or $R^2$ is fluorine or fluorine-containing; and n=1; or from Formula (2) wherein one of $R^{4-7}$ is fluorine or fluorine-containing. More preferably, the etchant compound is selected from Formula (1) wherein: n=1; m=0, 1, 2, or 3; and $R^1$ & $R^2$=F; thereby simplifying Formula (1) to F—CO—$(CF_2)_m$—CO—F. In the most preferred embodiment, the etchant compound is oxalyl fluoride (Formula (1) wherein m=0 and n=1).

It has been found that these etchant compounds, upon decomposition under plasma etching conditions, are capable of producing reactive species that tend to react chemically with the surface of a wide variety of materials to form volatile compounds. Until now, this capability has not been appreciated. Although oxalyl fluoride ($C_2O_2F_2$ or F—CO—CO—F), a highly preferred compound for use in the present invention, has been used as an etchant-modifier in an etching composition to etch $SiO_2$ over Si (see U.S. Pat. Nos. 5,445,712 and 5,376,234), it was not recognized as an effective etchant itself. Additionally, carbonyl difluoride (F—CO—F of CO—$F_2$), another preferred compound of the present invention, has been combined with oxygen to etch $SiO_2$ over Si (see J. W. Corban, Eric Kay, *Some Chemical Aspects of the Fluorocarbon plasma Etching of Silicon and its Compounds*, 23.1 IBM J. DEVELOP. 33 (January 1979)), but its ability to etch a wide variety of non-silicon or non-silicon dioxide materials was not recognized.

The etchant compounds for use in the present invention have a low GWP. Prior art etching compositions tend to have high GWPs due to the use of perfluorinated or sulfur-based etchants. Examples of these traditional etchants are compared below to oxalyl fluoride ($C_2O_2F_2$), a preferred etchant compound for use in the present invention:

| Etchant | GWP |
| --- | --- |
| $C_2O_2F_2$ | 0 |
| $SF_6$ | 23900 |
| $CF_3SCF_3$ | 1900 |
| $CF_4$ | 6500 |
| $C_2F_6$ | 9200 |
| $CHF_3$ | 11700 |

It is clear that oxalyl fluoride, having 0 GWP, is far more environmentally acceptable than the traditionally-used etchants. In a preferred embodiment, the etching or cleaning composition of the present composition minimizes the use of traditional etchants. Preferably, the composition is substantially free of perfluorinated etchants which have a GWP of greater than 5000 and sulfur-based etchants which have perfluorinated side chains and which have a GWP of greater than 1500. "Substantially free" as used herein refers to a concentration by volume in the etching composition of no greater than about 1%, and preferably no greater than 0.1%. The etchant compound preferably has a GWP of no greater than about 1500, more preferably no greater than about 1000, and even more preferably no greater than about 500. In the most preferred embodiment, the etchant compound of the present invention has essentially no GWP.

Pursuant to the present invention, it is possible to formulate from these etchant compounds etching or cleaning compositions which have low GWP. As used herein, the "GWP" of a composition refers to a weighted average of the GWPs of the composition's constituents. For example, a composition comprising 60% by weight of a 1000 GWP compound and 40% by weight of a 500 GWP compound would have a GWP of 800. In another preferred embodiment, the GWP of the etching composition is no greater than about 3,000, more preferably no greater than 1500, still more preferably no greater than about 1000, even more preferably no greater than about 500, and yet still more preferably no greater than about 100.

The etchant compounds for use in the present invention not only contribute little to the composition's GWP, but also tend to be consumed with such efficiency that a relatively small amount of unreacted etchant compound exits in the reaction effluent. Additionally, these compounds dissociate and/or react producing a low-GWP effluent. The "GWP" of effluent refers to a weighted average of the GWPs of the effluent's constituents. In the preferred embodiment, the effluent contains relatively small amounts of traditional high-GWP reaction products such as $CF_4$. For example, oxalyl fluoride reacts essentially completely and its breakdown compounds include HF, $CO_2$ and CO, all of which are relatively benign to the environment. Preferably, the effluent has a GWP of no greater than about 5000, more preferably no greater than about 3000, still more preferably no greater than about 1500, yet more preferably no greater than about 1000, yet even more preferably no greater than about 500, and still yet more preferably no greater than 100.

Aside from having low GWPs, the etching/cleaning composition of the present invention and a substantial portion of the reaction products formed therefrom are also amenable to water scrubbing using conventional scrubbing technology and chemical systems. By comparison, commonly-used etchants $CF_4$, $C_2F_6$, and $C_3F_8$ are only partially consumed and a substantial amount of the perfluorocarbons are present in the effluent. These perfluorocarbons are neither environmentally acceptable (as indicated by their GWPs above), nor readily removed by scrubbing.

Therefore, due to their low GWP and the ability of their effluent to be more efficiently scrubbed, the etching/cleaning compositions of the present invention can be used with little fear of contributing to global warming and without the need for complex and costly capture/recycle and/or abatement systems.

The etchant compounds for use in the present invention are commercially-available or can be readily synthesized from commercially-available starting materials. For example, U.S. Pat. No. 4,260,561 issued to Franz discloses the preparation of fluorinated carbonyl difluorides by fluorination of the corresponding carbonyl dichlorides with hydrogen fluoride. Additionally, Japanese Patent 99358-1994 issued to Tokuyama et al. teaches a method of making oxalyl fluoride by reacting oxalyl chloride in a non-protonic solvent using alkali fluorides.

The amount of etchant compound(s) in the etching/cleaning composition should be sufficient to impart the desired degree of etching capability. It is believed that, for most applications, the concentration of the etchant compound in the etching composition should be no less than about 1% by volume. Preferably, the etchant compound in the etching composition should comprise by volume no less than about 20%, and more preferably no less than about 50%.

The etching/cleaning composition of the present invention may comprise other constituents in addition to etchant compound(s). The additional constituents may be used to aid etching and/or impart "selectivity."

The term "selectivity" refers to the ability of the etching composition to etch one material at a different etch rate than another material. Although the ability of the etchant compounds to react with a variety of materials indiscriminately renders a composition of just said etchants well suited for applications like cleaning, where it is desirable to remove all types of films and residues equally, it may lack adequate selectivity for etching applications. At a minimum, some degree of selectivity is needed in etching applications such that the etching composition etches the underlying material at a greater rate than the photoresist. The etchant compounds for use in the present invention possess this "photoresist" selectivity.

There are some applications, however, that require selectivity between different materials of the substrate to be etched. To impart such selectivity, it may be desirable to add at least one etchant-modifier to the etching composition. Etchant-modifiers and their function are well known in the art (see, for example, Zhang et al., *Fluorocarbon High Density Plasmas. VII. Investigation of Selective* $SiO_2$-to-$Si_3N_4$ *High Density Plasma Etch Processes*, J. VAC. SCI. TECHNOL A14(4) (July/August 1996)). Consequently, one skilled in the art can determine the types and amounts of etchant-modifiers to use to achieve desired selectivity.

For example, the addition of hydrogen and/or hydrogen-containing compounds, such as hydrocarbons and hydrofluorocarbons, to the etching composition tends to enhance polymerization on the surface of certain materials and not others. Polymerization tends to retard etch rates. For example, oxalyl fluoride alone does not exhibit much selectivity between materials, but when used with other hydrogen-containing gases it tends to exhibit favorable etch selectivities toward materials used in manufacturing semiconductors, such as polycrystalline Si, single crystal Si, $SiO_2$, and $Si_3N_4$. In a similar fashion, the addition of nitrogen to the etching composition tends to alter the chemistry of the plasma reaction thereby increasing polymerization on certain surfaces. Other compounds such as oxygen tend to increase the etch rate of oxygen-containing materials such as $SiO_2$.

In a preferred embodiment, the etchant-modifier comprises a compound selected from the group consisting of $O_2$, $H_2$, $N_2$, $C_1$–$C_5$ hydrocarbons, $C_1$–$C_5$ hydrofluorocarbons (HFCs), $C_1$–$C_4$ perfluorocarbons, and a compound, different from the etchant compound, but having a general formula selected from Formula (1) or (2) wherein at least one of $R^1$, $R^2$, or $R^{4-7}$ is hydrogen. More preferably, the etchant-modifier is neither included in Formulas (1) and (2), nor is it a $C_2$–$C_4$ perfluorocarbon. Still more preferably, the etchant-modifier is selected from $O_2$, $H_2$, $N_2$, $CH_4$, and $C_2$–$C_4$ HFCs.

Unlike conventional etching compounds where perfluorocarbons are preferred for their high-fluorine content, in the composition of the present invention, HFCs are preferred as etchant-modifiers due to their lower GWP and polymerizing capability. In an even more preferred embodiment, the etchant-modifier is an HFC, such as, for example, an isomer of pentafluoropropane, hexafluoropropane, tetrafluoroethane, and pentafluoroethane. In yet a more preferred embodiment, the HFC is either 1,1,1,3,3-pentafluoropropane or 1,1,1,3,3,3-hexafluoropropane.

The amount of etchant-modifier present in the etching/cleaning composition should be sufficient to impart the desired selectivity between materials. It has been found that effective selectivity is obtained wherein the concentration of the etchant-modifier in the etching composition by volume ranges from about 0.1 to about 99%, and more preferably, from about 5 to about 60%.

It may be preferable also to include other constituents in the etching composition. For example, it may be beneficial to introduce the etchant compound into the etching apparatus using a entraining carrier gas, such as argon, helium or mixtures thereof, especially to impart volatility to etching composition which have low vapor pressure (alternatively, liquid-feed systems may be employed to introduce low vapor pressure etching compositions). In addition, it may be desirable to add a high ionization energy gas, such as, for example, argon, helium, or mixtures thereof to the process to enhance ion bombardment of the material's surface.

The amount of entraining carrier gas or high energy gas present in the etching/cleaning composition should be sufficient to impart the desired volatility or additional ion concentration. It is believed that, for most applications, suitable results will be obtained with an etching composition comprising by volume from about 0.1 to about 99% and, preferably, from about 5 to about 60% of the carrier or high energy gas.

In effecting the etching method of the present invention, conventional apparatus and techniques can be employed.

Generally, to etch a substrate, one or more wafers are placed in a chamber and the pressure is reduced by a vacuum pump. A plasma is formed by introducing a suitable etching composition into a low-pressure chamber and then applying an RF field to the contents in the chamber. In this state, the energized species of the etching composition attack the material to be removed either physically by bombarding the surface or chemically by forming a volatile material, such as $SiF_4$, which can be pumped from the vacuum chamber. The process is stopped when the desired amount of material has been removed from the wafer surface. An overview of plasma etching is provided in W. KERN, THIN FILM PROCESS (1978) and in PLASMA ETCHING & INTRODUCTION (B. M. Manos et al. eds. 1989).

As is well known, there are many operating conditions of a plasma etching process that can have an effect on the results obtained. These conditions include, for example, the type of plasma etching (for example, reactive ion etching, plasma etching, and high-density etching), etching composition flow rate, wafer temperature, pressure, power, time, and bias. The interrelationship of these parameters is a function of the hardware configuration and the material being etched. One skilled in the art of plasma etching and cleaning can vary these parameters accordingly to etch a desired material satisfactorily. Exemplary operating conditions include etching gas flow rates from about 1 to about 500 standard cubic centimeters per minute (sccm); wafer temperatures from about −200 to about 200° C.; pressures from about 0.05 to about 500 mTorr; power from about 20 to about 5000 watts; and a bias voltage across the wafer or article being etched/cleaned ranging from about 1 to about 500 volts DC. The time of etching depends upon the desired amount of material to be removed and ranges from seconds to hours. In the use of oxalyl fluoride, it has been found that effective etching can be achieved using the reactive ion etch method with an etching gas flow rate of about 1 to about 200 sccm, preferably about 5 to about 100 sccm; a pressure of about 0.05 to about 20 mTorr, preferably about 0.1 to about 10 mTorr; a wafer temperature of about 0 to about 150° C., preferably about room temperature; power from about 100 to about 1000 watts, preferably about 300 to about 700 watts; and a bias of about 10 to about 200 volts DC, preferably from about 25 to about 175 volts DC.

The following examples are illustrative of the practice of the present invention.

EXAMPLES

Examples 1–8

The first eight examples show the etching capability of oxalyl fluoride on various materials under different operating conditions. The specific conditions and average etch rates are set forth in Table 1 below.

Tests were performed in a lock load Plasma Therm electron cyclotron resonance (ECR) etcher with an ASTeX® source using wafers layered with different materials. In each experiment, wafers of single crystal silicon, polysilicon (10,000 Å thick, LPCVD deposited on a $SiO_2$ coated Si wafer), silicon dioxide (5000 Å thick, LPCVD deposited on a Si wafer), and silicon nitride (LPCVD deposited on Si, 5000 Å thick) were placed in the chamber. A mass flow meter was used to introduce a continuous flow of 20 sccm of oxalyl fluoride. The wafer temperature was about room temperature. Certain etching conditions were varied for each experiment as indicated Table 1. In each test, etching was stopped after 5 minutes and the amount of material removed was measured at seven positions on each wafer by ellipsometry and the etch rate was calculated based on the average amount of material removal. Table 1 below shows the results.

TABLE 1

Etch Conditions and Average Etch Rates

| Ex No. | DC Bias (volts) | Press. (mTorr) | Power (watts) | Etch rate (Å/min) | | | |
|---|---|---|---|---|---|---|---|
| | | | | Si | Poly Si | $SiO_2$ | $Si_3N_4$ |
| 1 | 41 | 1 | 350 | 206.4 | 220.6 | 315.8 | 269 |
| 2 | 39 | 1 | 700 | 177 | 189 | 273 | 199 |
| 3 | 46 | 5 | 350 | 150 | 87.3 | 124 | 184 |
| 4 | 45 | 5 | 700 | 95.1 | 189 | 188 | 88.7 |
| 5 | 155 | 1 | 350 | 716 | 603 | 829 | 801 |
| 6 | 157 | 1 | 700 | 540 | 590 | 744 | 749 |
| 7 | 155 | 5 | 350 | 479 | 468 | 581 | 561 |
| 8 | 155 | 5 | 700 | 528 | 508 | 638 | 780 |

The above examples show that materials commonly used in the fabrication of semiconductors are efficiently etched by plasma etching using oxalyl fluoride. Moreover, the results indicate that etching can be performed successfully under a wide variety of conditions, and that these conditions can be changed to achieve desired results.

In addition to the results set forth in Table 1, the vacuum chamber was examined after these experiments and no deposits were found on the walls. This evidenced another advantage of oxalyl fluoride as an etchant compound—longer times between equipment cleaning.

Example 9

This example shows that oxalyl fluoride has sufficient selectivity to etch silicon rather than the photoresist and is practical for the manufacture of semiconductors. A silicon wafer was coated with photoresist, patterned, and etched under conditions similar to Example 5. The photoresist was then removed after five minutes. Analysis of the resulting structure using an electron microscope revealed that the silicon etched at a greater rate than the photoresist.

Examples 10–14

These examples show the increased selectivity by adding etchant-modifiers to the etching composition. The following exemplary compositions are within the scope of the invention and comprise 20% by volume of oxalyl fluoride and 80% by volume of the indicated etchant-modifier:

| Example No. | Etchant-modifier |
|---|---|
| 10 | $CH_4$ |
| 11 | $O_2$ |
| 12 | $H_2$ |
| 13 | $CF_3CH_2CHF_3$ |
| 14 | F—CO—$CH_2$—CO—F |

These compositions selectively etch one material over another, and are suitable for etching different substrates of a wafer, for example, $SiO_2$ over Si.

What is claimed is:

1. A method of etching comprising subjecting a material under plasma etching conditions to an etching composition comprising at least the following constituents:

an etchant compound in an amount no less than 50% by volume of said etching composition and having a formula selected from the group consisting of F—CO—[(CR$^1$R$^2$)$_m$—CO]$_n$—F and F—CO—R$^3$—CO—F, wherein
m=0, 1, 2, 3, 4, or 5;
n=1;
R$^1$ & R$^2$ represent H, F or C$_x$H$_y$F$_z$; wherein:
  x=1 or 2; and
  y+z=2x+1;
R$^3$ represents C(R$^4$)=C(R$^5$), C(R$^6$R$^7$)=C or C≡C; wherein:
  R$^{4-7}$ represent H, F, or C$_x$H$_y$F$_z$; wherein:
    x=1 or 2; and
    y+z=2x+1; and
another constituent in addition to said etchant compound for aiding etching and/or imparting selectivity, said another constituent being substantially free of perfluorinated compounds having a GWP of greater than 5000 and sulfur-containing compounds with perfluorinated side chains having a GWP of greater than 1500.

2. The method of claim 1, wherein said etching composition has a GWP of no greater than about 3000.

3. The method of claim 2, wherein said etching composition has a GWP of no greater than about 1000.

4. The method of claim 3, wherein said etchant compound has the formula F—CO—[(CR$^1$R$^2$)$_m$—CO]$_n$—F and wherein m=0, 1, 2, or 3; and R$^1$ & R$^2$=F.

5. The method of claim 4, wherein said etchant compound has a formula selected from the group consisting of F—CO—CO—F and F—CO—(CF$_2$)$_m$—CO—F.

6. The method of claim 5, wherein said etchant compound has the formula F—CO—CO—F.

7. The method of claim 1, wherein said another constituent is present in an amount of at least 5% by volume of said etching composition.

8. The method of claim 1, wherein said another constituent selected from the group consisting of O$_2$, H$_2$, N$_2$, C$_1$–C$_4$ hydrocarbons, C$_1$–C$_4$ perfluorocarbons, and C$_1$–C$_5$ hydrofluorocarbons.

9. The method of claim 8, wherein said another constituent comprises at least one hydrofluorocarbon selected from the group consisting of pentafluoropropane, hexafluoropropane, tetrafluoroethane, and pentafluoroethane, and combinations of two or more thereof.

10. The method of claim 1, wherein said material is selected from the group consisting of: dielectrics selected from the group consisting of carbides, borides and suicides of metals or semi-metals; insulators selected from the group consisting of oxides, nitrides of metals or semi-metals, boronphosphorus silicate glass, and fluorosilicate glass; III–V semiconductor compounds; elemental materials selected from the group consisting of silicon, polycrystalline silicon, tungsten, titanium, vanadium, germanium, and silicon-germanium; and combination of two or more thereof.

11. The method of claim 1, wherein said material comprises one or more layers of a semiconductor.

12. A method of plasma etching comprising etching a surface of a non-silicon or non-silicon dioxide material with an etching composition which comprises at least:
one etchant compound having a formula selected from the group consisting of F—CO—[(CR$^1$R$^2$)$_m$—CO]$_n$—F and F—CO—R$^3$—CO—F, and wherein:
  m=0, 1, 2, 3, 4, or 5;
  n=0 or 1;
  R$^1$ & R$^2$ represent H, F or C$_x$H$_y$F$_z$; wherein:
    x=1 or 2; and
    y+z=2x+1;
  R$^3$ represents [R$^4$C=R$^5$C]C(R$^4$)=C(R$^5$), C(R$^6$R$^7$)=C or C≡C; wherein:
    R$^{4-7}$ represent H, F, or C$_x$H$_y$F$_z$; wherein:
      x=1 or 2; and
      y+z=2x+1; and
another constituent in addition to said etchant compound for aiding etching and/or imparting selectivity.

13. A method of cleaning a surface to remove residue adhered thereto comprising plasma cleaning said surface by contacting it with an etching composition comprising at least the following constituents:
an etchant compound in an amount no less than 50% by volume of said etching composition and having a formula selected from the group consisting of F—CO—[(CR$^1$R$^2$)$_m$—CO]$_n$—F and F—CO—R$^3$—CO—F, and wherein:
  m=0, 1, 2, 3, 4, or 5;
  n=1;
  R$^1$ & R$^2$ represent H, F or C$_x$H$_y$F$_z$; wherein:
    x=1 or 2; and
    y+z=2x+1;
  R$^3$ represents C(R$^4$)=C(R$^5$), C(R$^6$R$^7$)=C or C≡C; wherein:
    R$^{4-7}$ represent H, F, or C$_x$H$_y$F$_z$; wherein:
      x=1 or 2; and
      y+z=2x+1; and
at least one etchant-modifier to impart selectivity to the plasma etching, said etchant-modifier being substantially free of perfluorinated compounds having a GWP of greater than 5000 and sulfur-containing compounds with perfluorinated side chains having a GWP of greater than 1500.

14. The method of claim 13, wherein said etchant compound has the formula F—CO—[(CR$^1$R$^2$)$_m$—CO]$_n$—F and wherein m=0, 1, 2, or 3; and R$^1$ & R$^2$=F.

15. The method of claim 14, wherein said etchant compound has a formula selected from the group consisting of F—CO—CO—F and F—CO—(CF$_2$)$_m$—CO—F.

16. The method of claim 15, wherein said etchant compound has the formula F—CO—CO—F.

17. The method of claim 16, wherein said etchant-modifier is present in an amount of at least 5% by volume of said etching composition.

18. An etching composition comprising:
(A) an etchant compound in an amount no less than 50% by volume of said etching composition and having a general formula selected from the group consisting of F—CO—[(CR$^1$R$^2$)$_m$—CO]$_n$—F and F—CO—R$^3$—CO—F, and wherein:
  m=0, 1, 2, 3, 4, or 5;
  n=1;
  R$^1$ & R$^2$ represent H, F or C$_x$H$_y$F$_z$; wherein:
    x=1 or 2; and
    y+z=2x+1;
  R$^3$ represents C(R$^4$)=C(R$^5$), C(R$^6$R$^7$)=C or C≡C; wherein:
    R$^{4-7}$ represent H, F, or C$_x$H$_y$F$_z$; wherein:
      x=1 or 2; and
      y+z=2x+1; and
(B) another constituent in addition to said etchant compound for aiding etching and/or imparting selectivity, said another constituent being substantially free of perfluorinated compounds having a GWP of greater than 5000 and sulfur-containing compounds with perfluorinated side chains having a GWP of greater than 1500.

19. The composition of claim 18, wherein said another constituent is selected from the group consisting of O$_2$, H$_2$, N$_2$, CH$_4$, CF$_4$, and C$_1$–C$_5$ hydrofluorocarbons.

20. The composition of claim 19, wherein said another constituent comprises at least one hydrofluorocarbon selected from the group consisting of pentafluoropropane, hexafluoropropane, tetrafluoroethane, and pentafluoroethane and combinations of two or more thereof.

21. The composition of claim 18, wherein said another constituent is a carrier gas that imparts volatility to said etching composition.

22. The composition of claim 18, wherein said another constituent is selected from the group consisting of argon, helium, and mixtures thereof.

23. The composition of claim 18, wherein said another constituent is present in an amount of at least 5% by volume of said etching composition.

* * * * *